United States Patent
Kost et al.

(10) Patent No.: US 7,482,865 B2
(45) Date of Patent: Jan. 27, 2009

(54) SYSTEMS AND METHODS FOR CORRECTING ERRORS RESULTING FROM COMPONENT MISMATCH IN A FEEDBACK PATH

(75) Inventors: Michael A. Kost, Cedar Park, TX (US); Jack B. Andersen, Cedar Park, TX (US); Daniel L. W. Chieng, Austin, TX (US)

(73) Assignee: D2Audio Corporation, Austin, TX (US)

(*) Notice: Subject to any disclaimer, the term of this patent is extended or adjusted under 35 U.S.C. 154(b) by 85 days.

(21) Appl. No.: 11/672,331

(22) Filed: Feb. 7, 2007

(65) Prior Publication Data

US 2008/0278230 A1 Nov. 13, 2008

Related U.S. Application Data

(60) Provisional application No. 60/771,147, filed on Feb. 7, 2006.

(51) Int. Cl.
*H03F 3/38* (2006.01)
(52) U.S. Cl. .................................. 330/10; 330/251
(58) Field of Classification Search .............. 330/10, 330/251, 207 A
See application file for complete search history.

(56) References Cited

U.S. PATENT DOCUMENTS

| | | | | |
|---|---|---|---|---|
| 6,147,553 A | * | 11/2000 | Kolanek | 330/10 |
| 6,232,833 B1 | * | 5/2001 | Pullen | 330/10 |
| 6,362,683 B1 | * | 3/2002 | Miao et al. | 330/10 |
| 7,312,654 B2 | * | 12/2007 | Roeckner et al. | 330/10 |

* cited by examiner

*Primary Examiner*—Henry K Choe
(74) *Attorney, Agent, or Firm*—Law Offices of Mark L. Berrier (57) ABSTRACT

Systems and methods for minimizing performance degradation due to component mismatch in the feedback path of a digital PWM amplifier feedback loop. One embodiment comprises a digital pulse width modulated (PWM) amplifier with feedback. The amplification subsystem receives a digital audio signal and produces an analog output signal. The feedback loop produces a feedback signal based on the filtered analog output signal and modifies the digital audio signal based on the feedback signal. The feedback loop includes a filter configured to filter the analog output signal and correction circuitry configured to correct component mismatch errors introduced by the filter. In one embodiment, the correction circuitry receives a measurement of a power supply voltage, multiplies the measured voltage by a gain and adds the scaled measurement to the feedback signal to correct for the component mismatch errors.

20 Claims, 5 Drawing Sheets

SYSTEMS AND METHODS FOR CORRECTING ERRORS RESULTING FROM COMPONENT MISMATCH IN A FEEDBACK PATH

RELATED APPLICATIONS

This application claims the benefit of U.S. Provisional Patent Application 60/771,147, filed Feb. 7, 2006, which is incorporated by reference as if set forth herein in its entirety. This application is related to U.S. patent application Ser. No. 11/672/321, entitled "Power Supply Feed Forward Analog Input Filter Component Mismatch Correction", by Kost, et al., filed Feb. 7, 2007 which is incorporated by reference as if set forth herein in its entirety.

BACKGROUND

1. Field of the Invention

The invention relates generally to audio amplification systems, and more particularly to systems and methods for minimizing performance degradation due to component mismatch in the feedback path of a digital PWM amplifier feedback loop.

2. Related Art

Practical audio power amplifiers using Pulse Width Modulation (PWM) have been known since the mid 1960s. In amplifiers from that era, a pulse train was generated by comparing a voltage representing the incoming audio signal with a reference waveform, typically a triangular wave or sawtooth wave, with a frequency in the range 50 kHz-200 kHz. The comparison yielded a 2-level rectangular wave having the same frequency as the reference waveform, and with a mark: space ratio varying in sympathy with the audio. The rectangular wave was amplified to the desired power level and then passively lowpass filtered to remove most of the high-frequency components of the rectangular wave, leaving its average level, which follows the audio, to drive a load such as a loudspeaker.

It is possible to obtain extremely good performance when such amplifiers are run 'open-loop', that is without feedback, but it is an expensive solution, since the amplifier's performance is critically dependent on the quality of the output stages and the power supply. To alleviate these dependencies, the trend in the 1970's, and subsequently, has been to incorporate feedback. One simple way to incorporate feedback in an amplifier that compares the audio with a triangle wave is to replace a fixed triangle wave by a sawtooth wave that is obtained by integrating the substantially rectangular waveform. Analysis shows that this is an effective means of providing feedback. Moreover since the feedback is tightly integrated into the pulse width modulation itself, stability problems typically associated with feedback do not arise.

Amplifiers as described above have sometimes been called 'digital' in the popular press, but we shall describe them as 'analog', because the timings of the edges of the rectangular waves can vary continuously in sympathy with the audio. We shall reserve the word 'digital' for an amplifier in which the edge timings are quantized, so that the edge timings can be represented digitally and the edges can be generated by counting pulses produced by a high-precision, high-frequency clock, such as a crystal oscillator. This principle was proposed by Sandier (Sandier, M., "Towards a Digital Power Amplifier" Audio Eng. Soc Preprint Number: 2135, September 1984,) who also realized that the apparent need for a clock frequency in the gigahertz region could be avoided by the use of oversampling and noise shaping. Several commercial products are now available that use this principle (see, for example, Harris, S., Andersen, J., and Chieng, D., "Intelligent Class D Amplifier Controller Integrated Circuit as an Ingredient Technology for Multi-Channel Amplifier Modules of Greater than 50 Watts/Channel" Presented at the AES115th Convention 2003 October 10-13 New York, Audio Eng. Soc. preprint # 5947.)

The digital principle brings precision to the generation of the PWM waveform, but the power amplification, typically accomplished by MOSFET (Metal Oxide Silicon Field Effect Transistors) power switches, remains a fundamentally analog process, and as such is vulnerable to non-ideal component behavior. There is a distortion associated with the switching called "dead-time distortion", and there is dependency on the power supply, just as with the original analog PWM amplifiers. Without feedback or other compensation, the gain of the output stage will be directly proportional to the supply voltage. This precludes the use of an inexpensive non-regulated power supply in low-cost applications, or condemns the system to relatively poor performance.

Andersen et al., in U.S. patent application Ser. No. 11/324,132 ("Andersen et al."), illustrated how to construct a digital PWM amplifier utilizing feedback techniques to improve performance. The described system uses analog-to-digital converters (ADCs) to sample and digitize the amplifier's analog output and/or the power supply for use in the feedback signal processing. This amplifier system utilized a PWM controller and independent ADCs for sampling the analog output and power supply.

SUMMARY OF THE INVENTION

One or more of the problems outlined above may be solved by the various embodiments of the invention. Broadly speaking, the invention comprises systems and methods for minimizing performance degradation due to component mismatch in the feedback path of a digital PWM amplifier feedback loop.

One embodiment comprises a digital pulse width modulated (PWM) amplifier with feedback. The amplification subsystem receives a digital audio signal and produces an analog output signal. The feedback loop produces a feedback signal based on the filtered analog output signal and modifies the digital audio signal based on the feedback signal. The feedback loop includes a filter configured to filter the analog output signal and correction circuitry configured to correct component mismatch errors introduced by the filter. In one embodiment, the correction circuitry receives a measurement of a power supply voltage, multiplies the measured voltage by a gain and adds the scaled measurement to the feedback signal to correct for the component mismatch errors.

In one embodiment, the system includes analog filters to filter both the analog output signal and the power supply measurement. Each of the filters is followed by an analog-to-digital converter (ADC) which digitizes samples of the corresponding signal. Each of the ADC's is followed by a serial interface which de-serializes the data. The de-serialized data from each serial interface is forwarded to a decimator that reduces the sample rate to a desired rate. The outputs of the decimators are then multiplied (scaled) by corresponding gains, after which the scaled power supply measurement is added to the feedback signal. This corrected feedback signal is then provided to a loop stability processing unit, and the output of this unit is added to the digital audio signal.

The amplifier may include a non-linearity correction unit to correct the digital audio signal for non-linearities caused by conversion of the digital audio signal to a PWM signal. The digital audio signal may then be quantized and noise shaped before being forwarded to a pair of PWM modulators. The modulators are configured to generate PWM waveforms based on the digital audio signal. The amplifier includes a pair of half-bridge output stages in a full-bridge configuration to receive the PWM waveforms. The analog output signal is a difference between the outputs of the two half-bridge output stages, and may be applied to positive and negative terminals of a load such as a loudspeaker.

Another embodiment comprises a method implemented in a digital PWM amplifier having a feedback loop. The method includes producing an analog output signal based on a digital audio signal, filtering the analog output signal to produce a feedback signal, scaling a power supply measurement and adding the scaled power supply measurement to the feedback signal to reduce component mismatch errors in the feedback signal. In one embodiment, the analog output signal is produced by performing PWM non-linearity correction on the digital audio signal, adding the feedback signal with the scaled power supply measurement to the digital audio signal, quantizing and noise shaping the digital audio signal, generating PWM waveforms from the quantized digital audio signal, and generating the analog output audio based on the PWM waveforms. In one embodiment, the feedback signal and the power supply measurement are digitized and decimated before adding the scaled power supply measurement to the feedback signal. In one embodiment, the method includes determining the gain for scaling the power supply measurement, including the steps of providing an input tone to the amplifier, selecting a feedback loop gain at which the open-loop output amplitude is approximately equal to the closed-loop output amplitude, closing the feedback loop, and selecting the power supply gain at which the measured value of total harmonic distortion plus noise is minimized.

Numerous other embodiments and variations are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for minimizing performance degradation due to component mismatch in the feedback path of a digital PWM amplifier feedback loop. One embodiment of the invention is implemented in a digital Class D pulse width modulated (PWM) amplifier that utilizes feedback as described by Andersen et al. In this embodiment, the amplified output of the amplifier's full-bridge output stage is filtered using analog filtering techniques and sampled by an analog to digital converter (ADC) before the passive inductor-capacitor filter that couples the output to a loudspeaker. The ADC's digital output is transported by a serial interface to a processing unit such as a decimation filter. The power supply is also filtered and sampled by an ADC. The digitized power supply value is then scaled and added to the feedback signal to correct for component mismatches in the analog filter of the feedback path.

Figure 1:
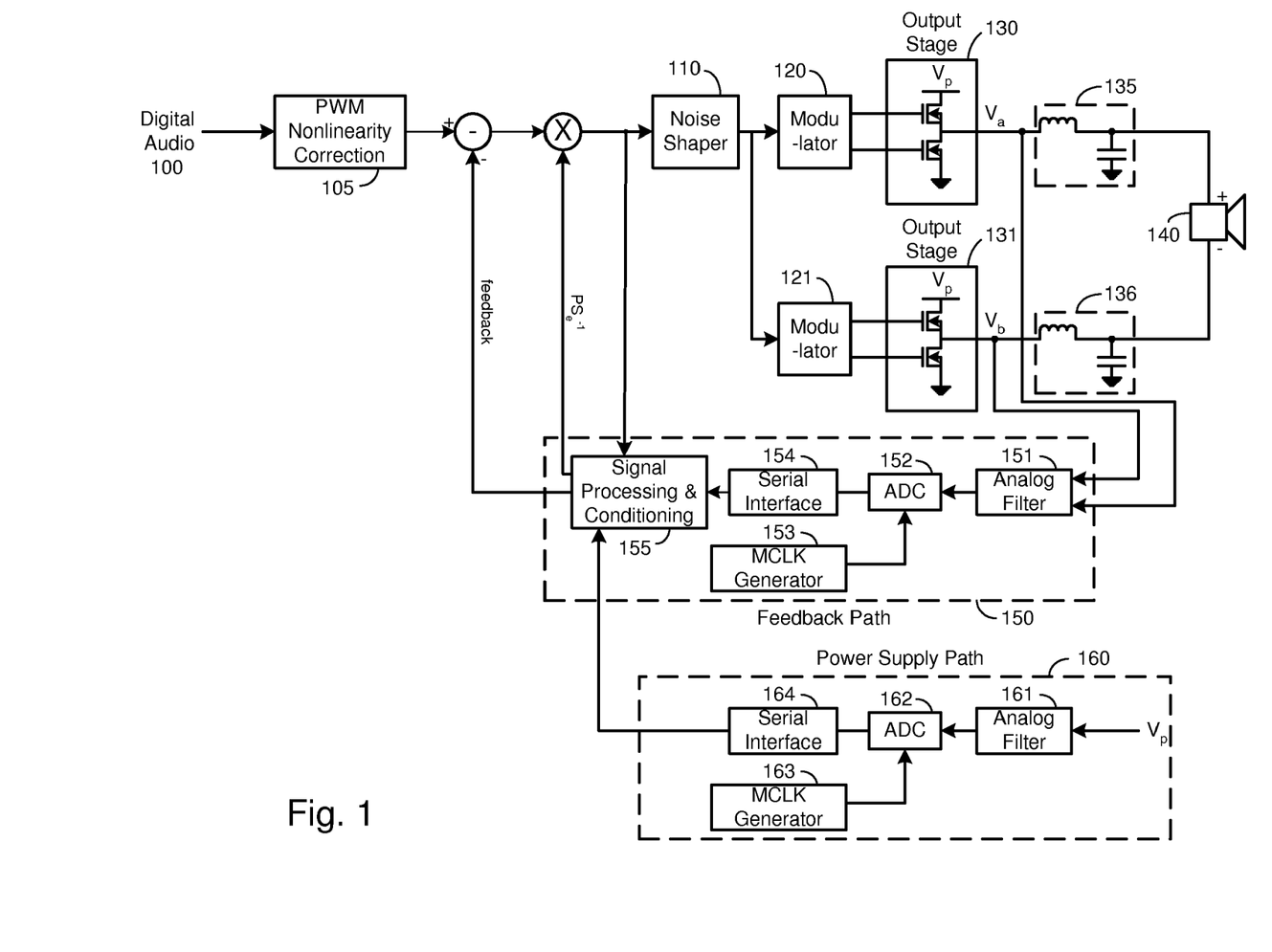
FIG. 1 is a functional block diagram illustrating a digital PWM amplification system utilizing feedback.

A typical digital PWM amplifier with feedback is shown in FIG. 1. As depicted in the figure, the PWM amplifier system comprises a digital audio signal (100), a PWM nonlinearity correction (105), a noise shaper (110), a modulator (120), an output stage (130), an LC low-pass filter (131), a load (140), a feedback path (150), and a power supply path (160). The feedback path consists of an analog filter (151), an ADC (152), an MCLK generator block (153), a serial interface block (154), and a signal processing & conditioning block (155). The power supply path consists of an analog filter (161), an ADC (162), an MCLK generator block (163), and a serial interface block (164). The output of the power supply path is directed toward the signal processing & conditioning block.

In normal operation, a digital audio signal (100) is provided to the amplifier. The digital audio signal (100) is typically in a 24-bit, pulse-code modulated (PCM) format and typically supplied at a 512 kHz sampling rate. A PWM nonlinearity correction block (105) applies a pre-correction to the digital audio signal that approximately corrects for the non-linear artifacts created by the PCM to PWM conversion. The pre-corrected digital audio is then summed with the "feedback" signal from the signal processing and conditioning block (155), multiplied by $PS_e^{-1}$ signal from the signal processing and conditioning block, and then noise-shaped in the noise shaper (110). The noise shaper typically quantizes the 24-bit PCM digital audio sample to a 10-bit PCM digital audio sample and uses noise shaping techniques to reduce the quantization noise inside the audio band, typically DC to 20 or 40 kHz. The modulator block (120) performs the PCM to PWM conversion on the 10-bit digital audio. 2-level modulation is typically used, but other PWM modulation schemes, like 3-level (class BD) modulation may also be used. The output stages (130, 131) amplify the PWM waveforms generated by the modulator blocks (120, 121), typically utilizing high voltage power supplies ($V_p$), high power field-effect transistors (FETs), and various other components. The output stages are in a full-bridge configuration with a positive bridge (130) and a negative bridge (131). The output stages' (130, 131) output is filtered by the passive LC filters (135, 136) to attenuate the PWM switching signal and is connected to the load (140), typically a loudspeaker, with the positive bridge connected to the positive load terminal and the negative bridge connected to the negative load terminal.

In the feedback path (150), the output of the output stages (130, 131) is filtered by an analog filter (151) and routed to the analog to digital converter (ADC) (152). The filter (151) is typically a 3$^{rd}$ order low-pass filter with a DC gain of 0.2 and 2 poles at 100 kHz and 1 pole at 500 kHz. The ADC (152) is typically a multi-bit delta-sigma audio converter and digitizes the analog filtered PWM output. The ADC (152) receives its Master clock (MCLK) from the MCLK generator (153). The MCLK rate is configured so that the ADC's delta-sigma output word rate matches the input word rate expected by the signal processing & conditioning block (155). Each delta-sigma word is typically 4 bits long and is serialized by the ADC (152) and transmitted by a serial bus to the serial interface (154), which deserializes the delta-sigma word and presents it to the signal processing and conditioning block (155). The signal processing and conditioning block (155) will typically decimate the incoming delta-sigma modulator word to the PWM sampling rate of 512 kHz, and then perform necessary signal processing to close and maintain the feedback loop as described in Andersen, et al.

In the power supply path (160), the output stage power supply ($V_P$) is filtered by an analog filter (161) and routed to the analog to digital converter (ADC) (162). The filter (161) is typically a $3^{rd}$ order low-pass filter with a DC gain of 0.2 and 2 poles at 200 kHz and 1 pole at 500 kHz. The ADC (162) is typically a multi-bit delta-sigma audio converter and digitizes the analog filtered PWM output. The ADC (162) receives its Master clock (MCLK) from the MCLK generator (163). The MCLK rate is configured so that the ADC's delta-sigma output word rate matches the input word rate expected by the signal processing & conditioning block (165). Each delta-sigma word is typically 4 bits long and is serialized by the ADC (162) and transmitted by a serial bus to the serial interface (164), which deserializes the delta-sigma word and presents it to the signal processing and conditioning block (155). The signal processing and conditioning block (155) will typically decimate the incoming delta-sigma modulator word to the PWM sampling rate of 512 kHz, and then perform any necessary signal processing to generate the $PS_e^{-1}$ signal.

The analog filter is of specific concern in real-world implementations. The overall system performance relies on the quality of the analog filter (151) and ADC (152) in the feedback path. The analog filter is typically constructed of several discrete passive components such as resistors and capacitors. Consider the typical analog filter topology shown in FIG. 2. $V_A$ is the output of the positive bridge output stage (130) from FIG. 1. $V_B$ is the output of the negative bridge output stage (131) from FIG. 1. Various resistors (R0, R1, R2, R3, and R4) and capacitors (C0, C1, and C2) are used in conjunction with an operational amplifier, or op-amp (210). It should be noted that components of the same name are designating components of the same value. Components associated with the negative input of the op-amp (220) are referred to as the inverting components. Components associated with the positive input of the op-amp (23) are referred to as non-inverting components. $V_{REF}$ is the common-mode bias point for the circuit and is typically supplied by the ADC that uses the output $V_{OUT}$. Those skilled in the art will recognize that the output of the illustrated analog filter is single-ended and, if called for by a specific ADC, an inverting stage may be used to construct a differential output. Those skilled in the art will also recognize that, although described for the feedback path, this circuit topology may be use for both the feedback path analog filter and the power supply path analog filter.

Figure 2:
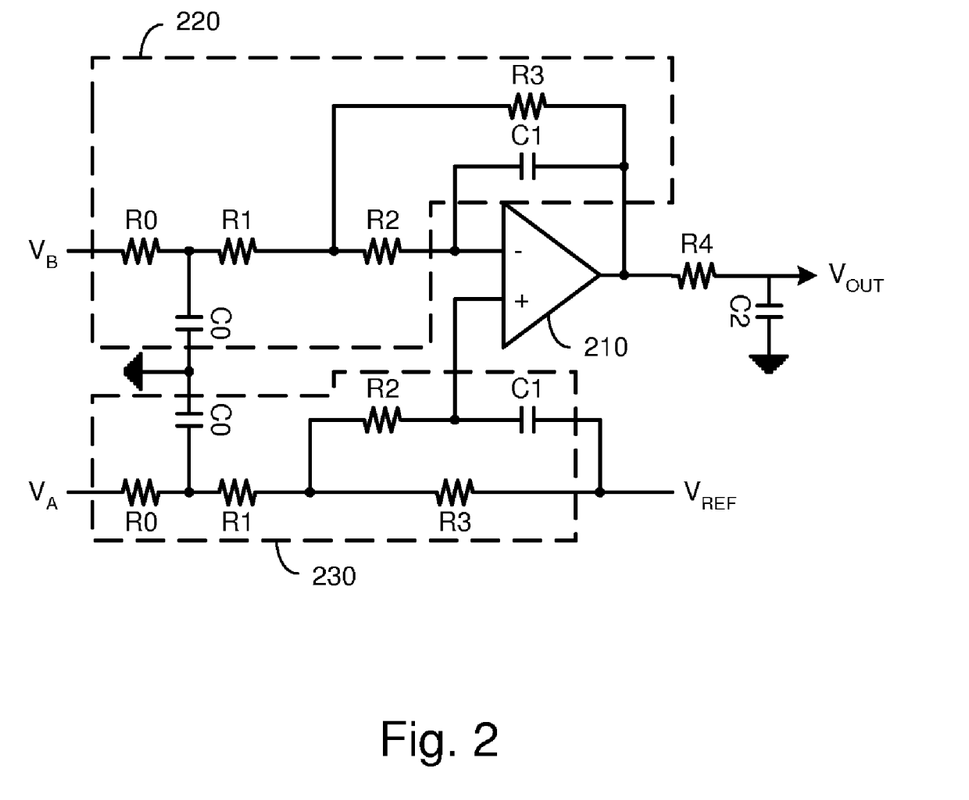
FIG. 2 is a functional block diagram illustrating a typical analog filter implementation.

The analog filter in FIG. 2 retains its highest performance if the non-inverting components in the non-inverting path have perfect matching with the same-named inverting components in the inverting path. In the real-world, typical resistors match to within 5% and high-quality resistors match to within 1%. Similarly, typical capacitors match to within 20% and high-quality capacitors match to within 5%. Because capacitor matching issues do not have much of an impact at audio frequencies (DC to 20 kHz) relative to resistor matching issues, capacitor mismatch is typically ignored. The result of imperfect matching is that the positive bridge output ($V_A$) is not summed equally with the negative bridge output ($V_B$), resulting in distortion that will couple to the amplifier output because of the feedback system. The system performance would improve if it were possible to compensate for the component mismatch.

Figure 3:
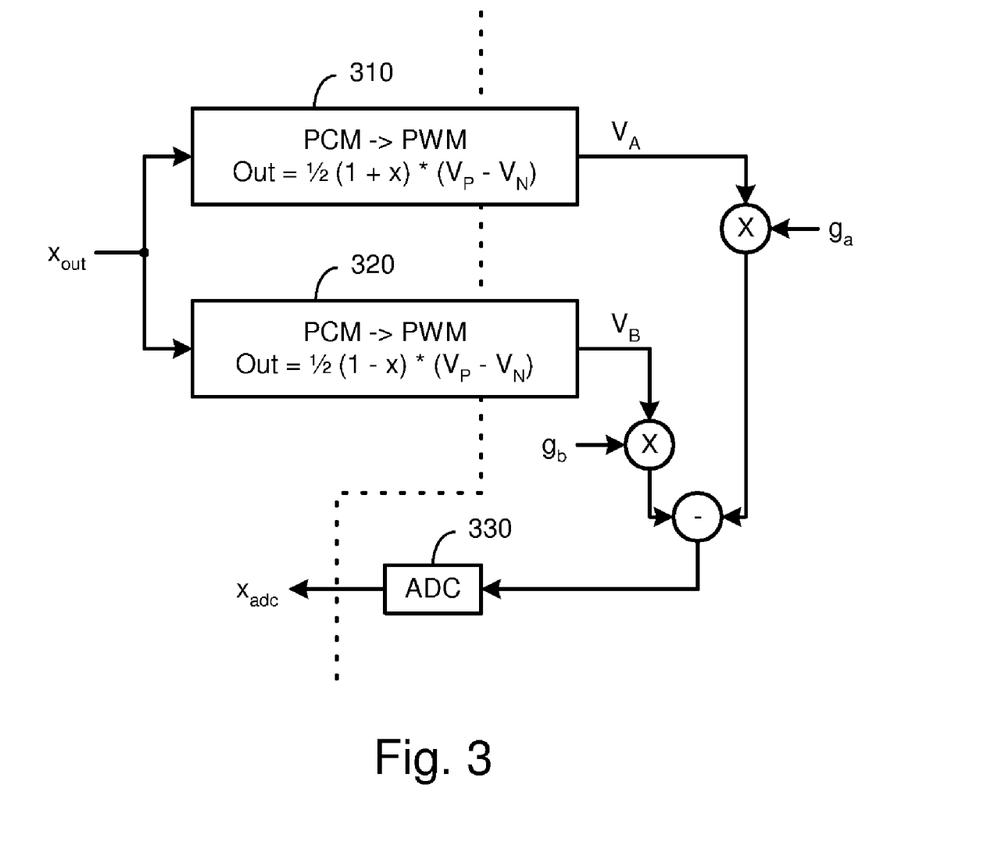
FIG. 3 is a mathematical model of the feedback path.

Consider the mathematical model in FIG. 3. This model represents the output stages and feedback path. $X_{out}$ is considered to be a decimal number between 1.0 and −1.0, with 1.0 corresponding to most positive output and −1.0 corresponding to most negative output. The positive bridge is modeled as "Out=½*(1+X)*($V_P$−$V_N$)" (310). The negative bridge is modeled as "Out=½*(1−x)*($V_P$−$V_N$)" (320). $V_N$, the negative output stage power supply, is represented for completeness, but is ground in typical full-bridge implementations, and thus is set to 0.0 and ignored in practice. The gains $g_a$ and $g_b$ represent the errors introduced by component variation from ideal values. For example, if perfect resistors were used, $g_a$ would be 1.0 and $g_b$ would be 1.0. The feedback ADC (330) is included for reference. The feedback value, $X_{adc}$, is the output of the mathematical model and corresponds to the output of the feedback path (150) in FIG. 1.

From FIG. 3, the expected value of $X_{adc}$ can be calculated as shown below.

$$V_a = \frac{1}{2} * (1 + x_{out}) * (V_p - V_n) + V_n$$

$$V_b = \frac{1}{2} * (1 - x_{out}) * (V_p - V_n) + V_n$$

$$x_{abc} = g_a * V_a - g_b * V_b$$

$$x_{abc} = \frac{g_a}{2} * (1 + x_{out}) * (V_p - V_n) + g_a * V_n - \frac{g_b}{2} * (1 - x_{out}) * (V_p - V_n) - g_b * V_n$$

$$x_{abc} = \frac{g_a * (V_p - V_n)}{2} + \frac{x_{out} * g_a * (V_p - V_n)}{2} -$$

$$\frac{g_b * (V_p - V_n)}{2} + \frac{x_{out} * g_b * (V_p - V_n)}{2} + V_n * (g_a - g_b)$$

$$x_{abc} = \frac{x_{out} * (V_p - V_n) * (g_a + g_b)}{2} + \frac{(V_p - V_n) * (g_a - g_b)}{2} + V_n * (g_a - g_b)$$

$$x_{abc} = \frac{x_{out} * (V_p - V_n) * (g_a + g_b)}{2} + \frac{(V_p - V_n) * (g_a - g_b)}{2} + \frac{2 * V_n * (g_a - g_b)}{2}$$

$$x_{abc} = \frac{x_{out} * (V_p - V_n) * (g_a + g_b)}{2} + \frac{(V_p + V_n) * (g_a - g_b)}{2}$$

$$V_n = 0$$

$$x_{abc} = \frac{x_{out} * (V_p - 0) * (g_a + g_b)}{2} + \frac{(V_p - 0) * (g_a - g_b)}{2}$$

$$x_{abc} = \frac{x_{out} * V_p * (g_a + g_b)}{2} + \frac{V_p * (g_a - g_b)}{2}$$

By setting $g_a$ and $g_b$ to 1.0, note that the $X_{adc}$ input collapses to the following: $X_{adc} = X_{out} * V_p$. This is expected for a full-bridge output stage. Observing $X_{adc}$, the error due to mismatch is divided into two parts. First, there is a signal-dependent gain term "$(g_a + g_b)/2$" and a signal-independent coupling of the power supply "$V_p * (g_a - g_b)/2$". It is therefore possible to correct for errors introduced by component variations by multiplying the feedback path input by a gain and adding the power supply path input, multiplied by a second gain.

Figure 4:
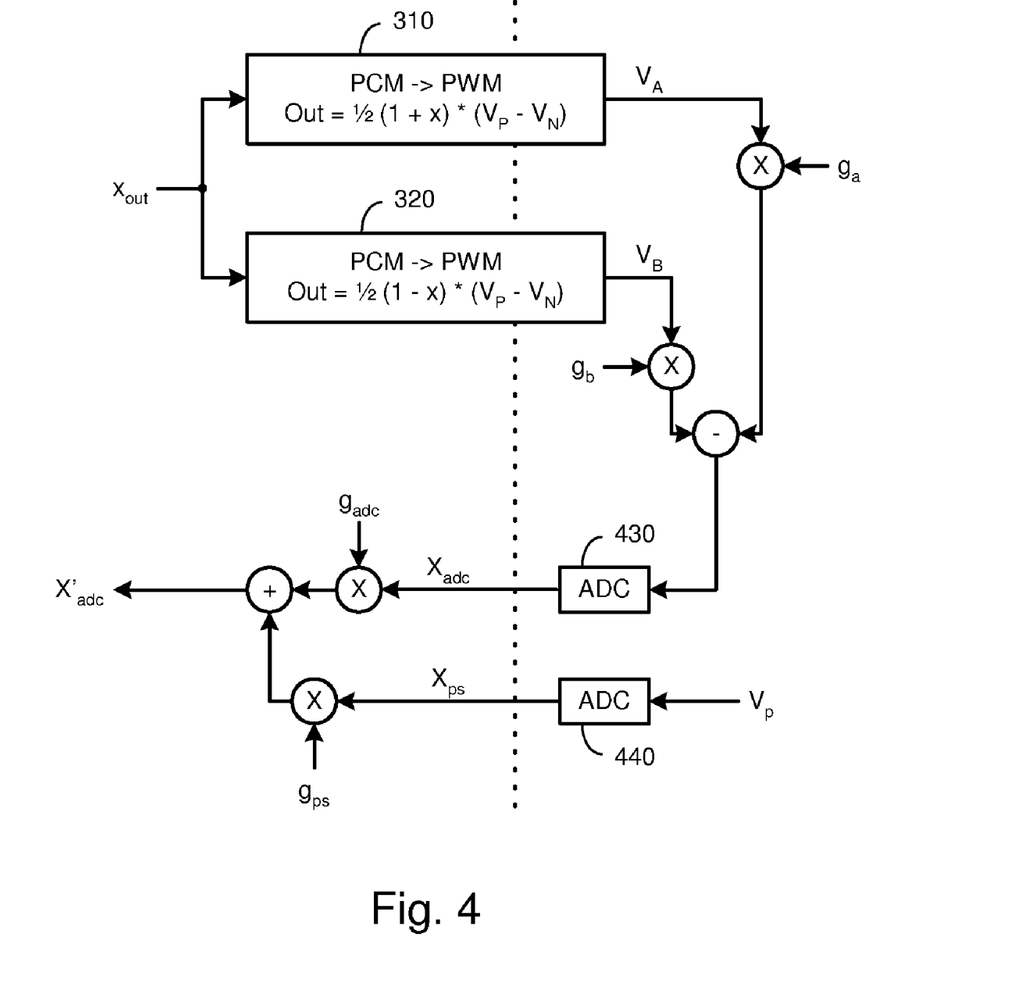
FIG. 4 is a mathematical model of the improved feedback path.

The performance of the system can be improved by adding a scaled power supply signal to the feedback signal as illustrated in FIG. 4. As in FIG. 3, the model represents the output stages and feedback path. $X_{out}$ is considered to be a decimal number between 1.0 and −1.0, with 1.0 corresponding to most positive output and −1.0 corresponding to most negative output. The positive bridge is modeled as "Out=½*(1+x)*($V_P$−$V_N$)" (410) and the negative bridge is modeled as "Out=½*(1−x)*($V_P$−$V_N$)" (420). $V_N$, the negative output stage power supply, is represented for completeness, but is ground in typical full-bridge implementations and thus is set to 0.0 and ignored in practice. The gains $g_a$ and $g_b$ represent the errors introduced by component variation from ideal values. For example, if perfect resistors were used, $g_a$ would be 1.0 and $g_b$ would be 1.0. The feedback ADC (430) and power supply ADC (440) are included for reference. The feedback value, $X_{adc}$, is the output of the mathematical model in FIG. 3 and corresponds to the output of the feedback path (150) in FIG. 1. The power supply value, $X_{ps}$ corresponds to the output of the power supply path (160) in FIG. 1. In the present system, however, the output of the power supply path is not simply provided to a [xxx], but A gain term $g_{adc}$ is used to scale the $X_{adc}$ input to correct for the signal dependent portion of the component variation error. A gain term $g_{ps}$ is used to scale $X_{ps}$ before summing with the scaled $X_{adc}$ term to produce the corrected $X'_{adc}$ output.

The derivation of the ideal $X'_{adc}$ as modified by the scaled power supply value is illustrated in the equations below.

$$x_{abc} = g_{abc} * \left( \frac{x_{out} * V_p * (g_a + g_b)}{2} + \frac{V_p * (g_a - g_b)}{2} \right) + X_{ps} * g_{ps}$$

$$g_{abc} = \frac{2}{(g_a + g_b)}$$

$$g_{ps} = \frac{-g_{abc} * (g_a - g_b)}{2}$$

$$x_{abc} = \frac{2}{(g_a + g_b)} * \left( \frac{x_{out} * V_p * (g_a + g_b)}{2} + \frac{V_p * (g_a - g_b)}{2} \right) - \frac{X_{ps} * 2 * (g_a - g_b)}{2 * (g_a + g_b)}$$

$$x_{abc} = x_{out} * V_p + \frac{V_p * (g_a - g_b)}{(g_a + g_b)} - \frac{V_p * (g_a - g_b)}{(g_a + g_b)}$$

$$x_{abc} = x_{out} * V_p$$

Calculating $g_{adc}$ and $g_{ps}$ from component values may not always be practical. Individual resistors may be difficult to measure in-system. Instead, they may be determined empirically to gain a reasonable improvement in system performance. The $g_{adc}$ gain can be established by comparing the amplifier gain with the feedback loop open versus the amplifier gain with the feedback loop closed. This is easily accomplished by playing a high amplitude tone, for example, −10 dbFS (10 dB below full scale). An analog measurement tool is used to compare the output amplitudes, and $g_{adc}$ is varied until the open-loop and closed-loop output amplitudes are approximately equal. To determine the value of $g_{ps}$, an analog measurement tool capable of measuring total harmonic distortion plus noise (THD+N) is used. A tone is again played into the amplifier with the feedback loop closed and $g_{ps}$ is varied to minimize the measured THD+N value.

Figure 5:
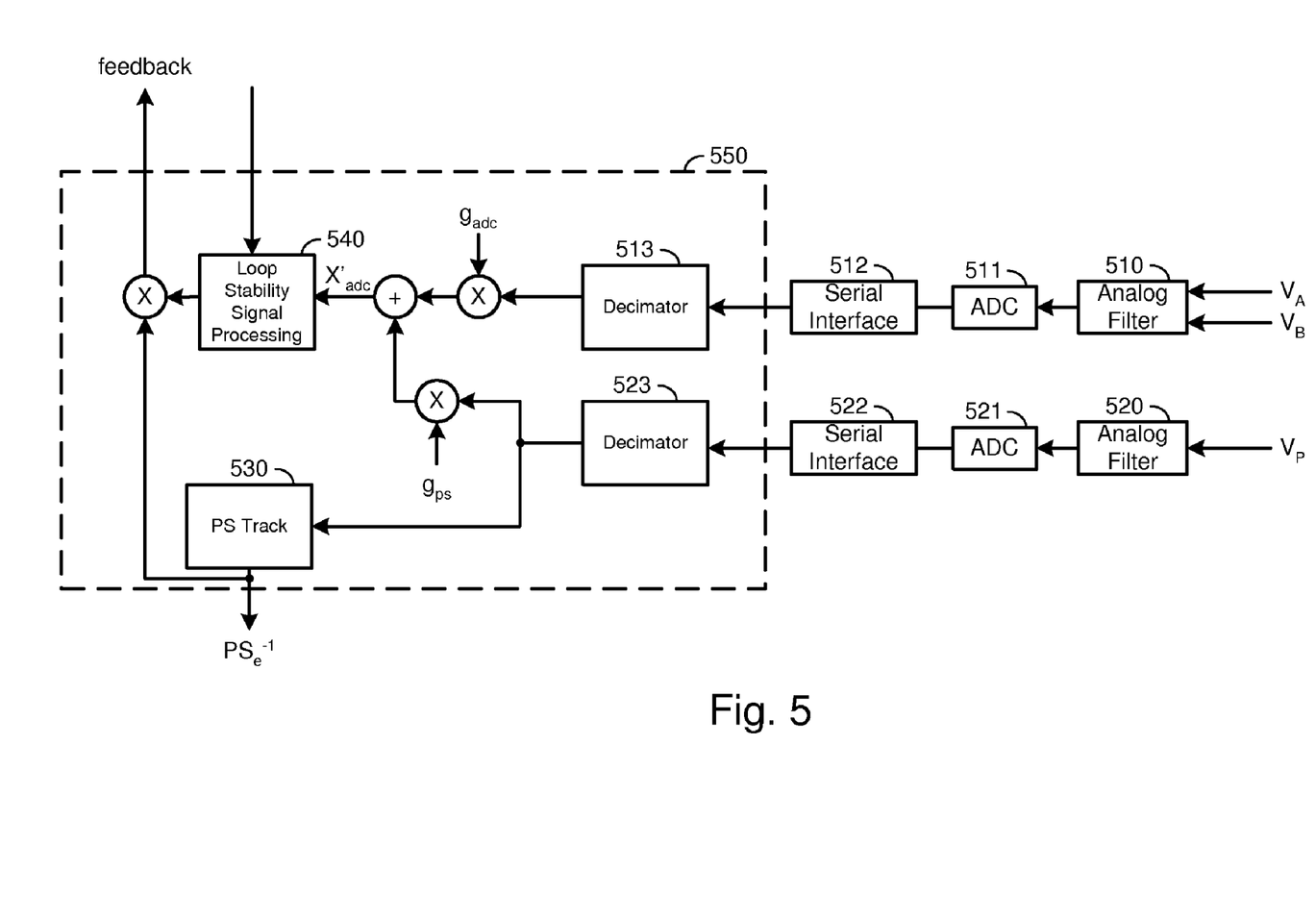
FIG. 5 is a functional block diagram illustrating an implementation for a signal processing & conditioning block in accordance with one embodiment of the invention.

The feedback component mismatch error correction described above can be implemented in a structure such as the one illustrated in FIG. 5. FIG. 5 depicts a set of components that form a feedback path and set of components that form a power supply path. The feedback path and power supply path are similar to the ones (150, 160) depicted in FIG. 1, but the scaled power supply voltage in the present system is used to modify the feedback signal, rather than simply being used for power supply estimation.

Referring to FIG. 5, the output voltages, $V_A$ and $V_B$, are input to an analog filter (510,) and the filtered difference signal is provided to an ADC (511.) The ADC digitizes the filtered signal and provides the digitized signal to a serial interface (512,) which deserializes the data and provides it to a decimator (513,) which reduces the rate of the digitized words to a desired rate. At the same time, a power supply measurement is filtered by a second analog filter (520,) digitized by a second ADC (521,) deserialized by a second serial interface (522) and decimated by a second decimator (523.)

Conventionally, the decimated signal at the output of the feedback decimator (513) would be supplied directly to the loop stability processing block (540) (possibly after being multiplied by a gain factor.) In the present system, however, the output of the power supply decimator (523,) the digitized and decimated power supply voltage measurement, is scaled by a gain factor, $g_{ps}$, and summed with the feedback signal of the feedback decimator (513) before the feedback signal is routed to the loop stability processing block (540.) The output of the power supply decimator (523,) scaled by a gain factor as described above, cancels the error in the feedback signal resulting from component mismatches in the feedback filter (510,) producing corrected feedback signal $X'_{adc}$. This signal is then fed to a loop stability signal processing block (540,) and the processed feedback signal is multiplied by a power supply estimate produced by a power supply estimation unit (530). The resulting feedback signal can then be added to the input audio signal.

It should be noted that the embodiments described above are intended to be illustrative. Alternative embodiments may implement one or more of the features described above using mechanisms or algorithms other than those described above. For example, while some embodiments may be implemented in PWM amplifiers, other embodiments may be implemented in other types of amplifiers or other systems in which it is desirable to minimize feedback delays. Similarly, while the embodiments disclosed above use a DSP to monitor the delay between generation and consumption of data words in the feedback path and to control the stretching of the corresponding MCLK signal, alternative embodiments may use other components or configurations to implement the delay minimization subsystem.

Those of skill in the art will understand that information and signals may be represented using any of a variety of different technologies and techniques. For example, data, information, signals, bits, and the like that may be referenced throughout the above description may be represented by voltages, currents, electromagnetic waves, or the like, including combinations thereof. The information and signals may be communicated between components of the disclosed systems using any suitable transport media, including wires, metallic traces, and so on.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality.

Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A digital PWM amplifier comprising:
   an amplification subsystem configured to receive a digital audio signal and to produce an analog output signal; and
   a feedback loop configured to produce a feedback signal based on the filtered analog output signal and to modify the digital audio signal based on the feedback signal;
   wherein the feedback loop includes a filter configured to filter the analog output signal; and
   wherein the feedback loop includes correction circuitry configured to correct component mismatch errors introduced by the filter.

2. The digital PWM amplifier of claim 1, further comprising a power supply configured to power the amplification subsystem, wherein the correction circuitry is configured to add a correction signal to the feedback signal, wherein the correction signal is proportional to a voltage of the power supply.

3. The digital PWM amplifier of claim 2, wherein the correction circuitry includes an analog-to-digital converter (ADC) configured to digitize the voltage of the power supply.

4. The digital PWM amplifier of claim 3, wherein the correction circuitry includes a decimator configured to decimate the digitized voltage of the power supply.

5. The digital PWM amplifier of claim 4, further comprising a multiplier configured to scale the voltage of the power supply by a gain factor.

6. The digital PWM amplifier of claim 1, wherein the feedback loop further comprises an analog-to-digital converter (ADC) configured to digitize the filtered analog output signal produced by the filter.

7. The digital PWM amplifier of claim 6, wherein the feedback loop further comprises a decimator configured to decimate the digitized output signal.

8. The digital PWM amplifier of claim 7, further comprising a multiplier configured to scale the digitized output signal by a gain factor.

9. The digital PWM amplifier of claim 1, wherein the amplification subsystem comprises a pair of half-bridge output stages in a full-bridge configuration, and wherein the analog output signal comprises a difference between a first output of a first one of the half-bridge output stages and a second output of a second one of the half-bridge output stages.

10. The digital PWM amplifier of claim 1, wherein the amplification subsystem comprises a non-linearity correction unit configured to correct the digital audio signal for non-linearities caused by conversion of the digital audio signal to a PWM signal.

11. The digital PWM amplifier of claim 1, further comprising a pair of PWM modulators configured to generate PWM waveforms based on the digital audio signal.

12. The digital PWM amplifier of claim 11, further comprising a pair of half-bridge output stages, wherein each of the half-bridge output stages is coupled to one of the PWM modulators and configured to generate an analog output signal based on the received PWM waveform.

13. The digital PWM amplifier of claim 12, wherein the half-bridge output stages are configured in a full-bridge topology, wherein the analog output signal produced by one of the half-bridge output stages is supplied to a positive terminal of a load and the analog output signal produced by the other of the half-bridge output stages is supplied to a negative terminal of the load.

14. The digital PWM amplifier of claim 13, wherein the load is a loudspeaker.

15. A method implemented in a digital pulse width modulated (PWM) amplifier, wherein the amplifier includes a feedback loop, the method comprising:
   producing an analog output signal based on a digital audio signal;
   filtering the analog output signal to produce a feedback signal;
   providing a power supply measurement;
   scaling the power supply measurement; and
   adding the scaled power supply measurement to the feedback signal to reduce component mismatch errors in the feedback signal.

16. The method of claim 15, wherein producing the analog output signal based on the digital audio signal comprises:
   receiving the digital audio signal;
   performing PWM non-linearity correction on the digital audio signal;
   adding the feedback signal with the scaled power supply measurement to the digital audio signal;
   quantizing the digital audio signal;
   performing noise shaping on the quantized digital audio signal;
   generating one or more PWM waveforms based on the quantized digital audio signal; and
   generating one or more analog output audio signals based on the PWM waveforms.

17. The method of claim 15, further comprising digitizing the feedback signal and the power supply measurement before adding the scaled power supply measurement to the feedback signal.

18. The method of claim 17, further comprising decimating the digitized feedback signal and the digitized power supply measurement before adding the scaled power supply measurement to the feedback signal.

19. The method of claim 15, further comprising determining a power supply gain for scaling the power supply measurement.

20. The method of claim 19, wherein determining the gain comprises:
   providing an input tone to the amplifier;
   selecting a feedback loop gain at which an output amplitude with the feedback loop open is approximately equal to an output amplitude with the feedback loop closed;
   closing the feedback loop; and
   selecting a power supply gain at which a measured value of total harmonic distortion plus noise is minimized.

* * * * *